United States Patent
Ross et al.

(10) Patent No.: US 6,906,369 B2
(45) Date of Patent: Jun. 14, 2005

(54) MAGNETIC MEMORY ELEMENTS USING 360° WALLS

(75) Inventors: Caroline A. Ross, Boston, MA (US); Fernando J. Castano, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/775,600

(22) Filed: Feb. 10, 2004

(65) Prior Publication Data

US 2004/0211996 A1 Oct. 28, 2004

Related U.S. Application Data

(60) Provisional application No. 60/446,307, filed on Feb. 10, 2003.

(51) Int. Cl.[7] .............................................. H01L 29/76
(52) U.S. Cl. ..................... 257/295; 428/692; 428/694; 428/900; 365/129; 365/158; 365/173
(58) Field of Search .................... 428/692, 694, 428/900; 365/129, 158, 173

(56) References Cited

U.S. PATENT DOCUMENTS

| | | | |
|---|---|---|---|
| 5,541,868 A | 7/1996 | Prinz | |
| 6,391,483 B1 | * 5/2002 | Zhu et al. | ................... 428/692 |

FOREIGN PATENT DOCUMENTS

| WO | WO 02/13208 | 2/2002 |
|---|---|---|
| WO | WO 2004/047113 | 6/2004 |

OTHER PUBLICATIONS

"Metastable States in Magnetic Nanorings," Castano et al. *Physical Review.* vol. 67, n. 184425 (May 2003).
"Magnetization Reversal in Elliptical–ring Nanomagnets," Castano et al., *J. of Physics D Applied Physics,* vol. 36, pp. 2031–2035 (Sep. 30, 2003).
"Mesoscopic FCC Co Ring Magnets," Vaz et al., *J. of Magnetism and Magnetic Materials,* vol. 249, n. 1–2 (Aug. 2002).
"Switching Properties of Free–Standing Epitaxial Ring Magnets," Klaui et al., *J. of Magnetism and Magnetic Materials,* vol. 240, n. 1–3 (Feb. 2002).
"Observation of a Bi–Domain State and Nucleation Free Switching in Mesoscopic Ring Magnets," Rothman et al., *Physical Review Letters,* vol. 86, n. 6 (Feb. 5, 2001).
"Fast and Controllable Switching in Narrow Ring Nanomagnets," Lopez–Diaz et al., *J. of Magnetism and Magnetic Materials,* vol. 242–245, pp. 553–558 (Apr. 2002).
"Domain Structure of Circular and Ring Magnets," Kazakova et al., *J. of Magnetism and Magnetic Materials,* vol. 258–59, pp. 348–351 (Mar. 2003).
"Ultrahigh density vertical magnetoresistive random access memory (invited)," Zhu et al. *Journal of Applied Physics.* May 2000. vol. 87, No. 9.

* cited by examiner

*Primary Examiner*—David Nelms
*Assistant Examiner*—Mai-Huong Tran
(74) *Attorney, Agent, or Firm*—Gauthier & Connors LLP

(57) ABSTRACT

A magnetic-ring structure includes at least two states, and at least one twisted state that includes a 360° domain wall that can exist over a wide range of applied fields.

10 Claims, 9 Drawing Sheets

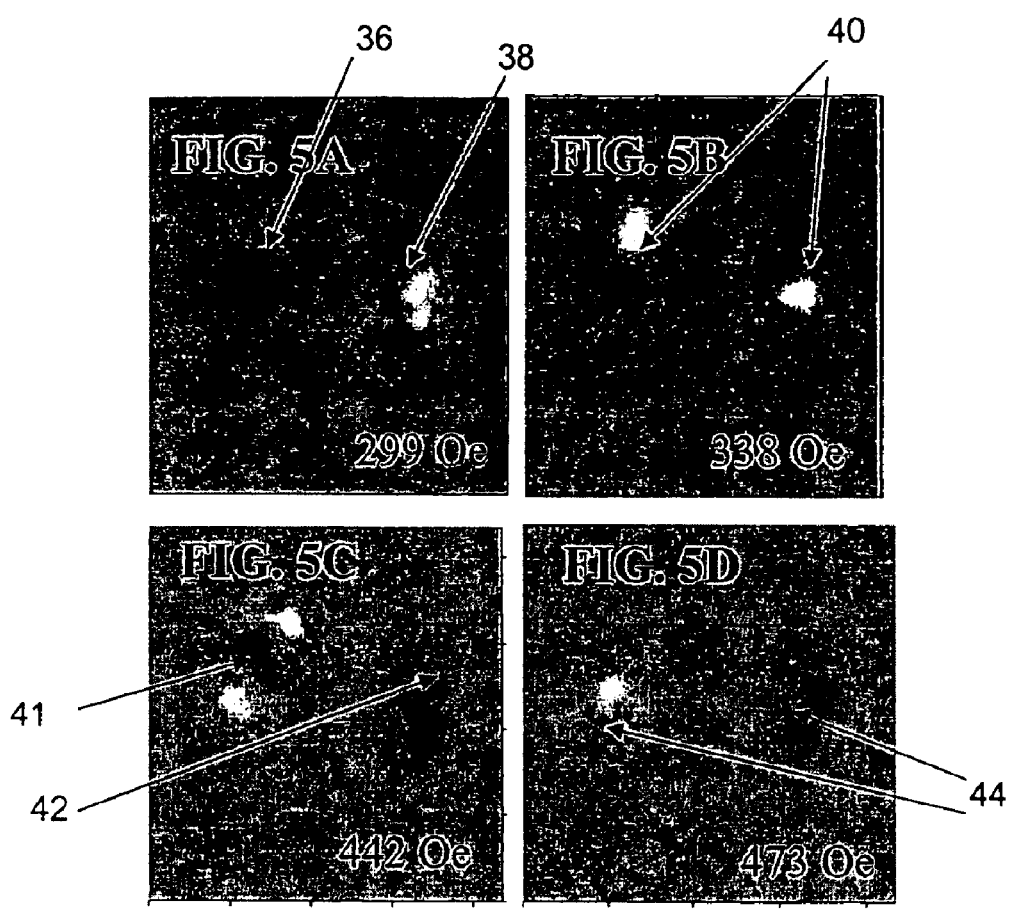

MAGNETIC MEMORY ELEMENTS USING 360° WALLS

PRIORITY INFORMATION

This application claims priority from provisional application Ser. No. 60/446,307 filed Feb. 10, 2003, which is incorporated herein by reference in its entirety.

BACKGROUND OF THE INVENTION

The invention relates to the field of magnetic memory, and in particular to ring-shaped memory elements having twisted states comprising 360° domain walls in the ring structure.

The use of magnetic memory that incorporates thin-film ring-shaped memory elements is known in the art. In such structures, each ring can store a bit of information depending on its magnetic state. The rings are written by applying magnetic fields (the fields are produced by passing currents through adjacent conductive lines). The data-bit in the rings is read back by detecting the rings' electrical resistance, which depends on their magnetic states. The dependence of resistance on magnetic state is called magnetoresistance. To use magnetoresistance for data readback it is most convenient to make the memory element out of a magnetic multilayer, for instance two magnetic layers separated by a non-magnetic spacer. In such a multilayer (called a spin-valve or tunnel junction), the resistance can vary by up to about 10–50% depending on the relative magnetization directions of the two magnetic layers and the structure of the multilayer.

The idea of using multilayer magnetic rings for data storage has been suggested previously, e.g., Zhu et al, J Appl. Phys. 87 6668 2000. In this case, two possible magnetic states of the rings have been identified, called "onion" and "vortex" states. The idea is to use the two vortex states to store a bit, e.g. a clockwise vortex represents a 1 and a counterclockwise vortex is a 0.

However, there is a need in the art to have a twisted magnetic state, which consists of a 360° domain wall in the ring. This state has not been reported by any other groups. It would be useful for data storage in rings, because it is quite a stable state. Also, it could allow more than one bit to be stored on a single ring. The twisted state only occurs in very small rings, which is relevant for high density storage.

SUMMARY OF THE INVENTION

According to one aspect of the invention, there is provided a magnetic-ring structure. The magnetic-ring structure includes at least two magnetic states, and at least one twisted state that includes a 360° domain wall that can exist over a wide range of applied fields.

According to another aspect of the invention, there is provided a magnetoresistive readback mechanism for retrieving magnetic information. The magnetoresistive readback mechanism includes a spacer layer and a pinned magnetic layer adjacent to the magnetic-ring. A magnetic storage layer is coupled to the spacer layer and includes a magnetic-ring comprising at least two states and at least one twisted state that includes a 360° domain wall that can exist over a wide range of applied fields.

According to yet another aspect of the invention, there is provided a method of operating a magnetic-ring structure. The method includes providing the magnetic-ring structure with at least two states, and providing at least one twisted state that includes a 360° domain wall that can exist over a wide range of applied fields.

BRIEF DESCRIPTION OF THE DRAWINGS

FIGS. 5A–5D are micrographs demonstrating the complex twisted states formed in a 520 nm diameter ring, imaged at remanence;

DETAILED DESCRIPTION OF THE INVENTION

The invention involves using magnetization states and hysteresis behavior of small ferromagnetic rings with diameters below about 500 nm and thicknesses of a few nanometers. These structures can be engineered to display different stable magnetized states depending on their shape, dimensions, and composition. An understanding of the stability of different states, and the ability to control the switching field, enables magnetic rings to find application in high-density magnetic random access memories, magnetic logic or other magnetoelectronic devices.

Data storage has previously been carried out using magnetic discs, wires or bars, but thin ring-shaped magnets have recently been the subject of several theoretical and experimental studies. To date, micron-diameter rings and 300–800 nm diameter octagonal ring structures have been produced. Experimental results on these structures support the existence of just two different magnetic states: one being the flux-closure or vortex state and the other a bi-domain state with two 180° domain walls, called an onion state. However, in smaller diameter rings, a new metastable state called a twisted state has been found, in addition to the expected onion and vortex magnetization states. This twisted state contains a 360° domain wall and can exist over a wide range of applied fields. Micromagnetic modeling shows that the twisted state is stabilized in small diameter, narrow rings. Additionally, more complex configurations such as double twisted states with two 360° walls have been observed.

Figure 1A:
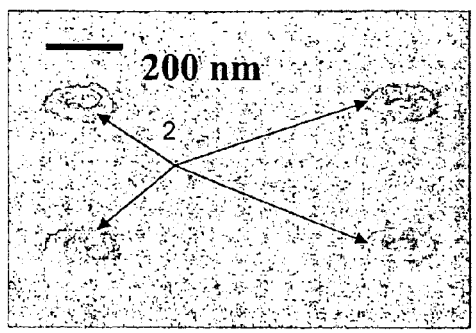
FIGS. 1A–1D are scanning electron micrographs of Co rings having varying diameters and widths.
Figure 1B:
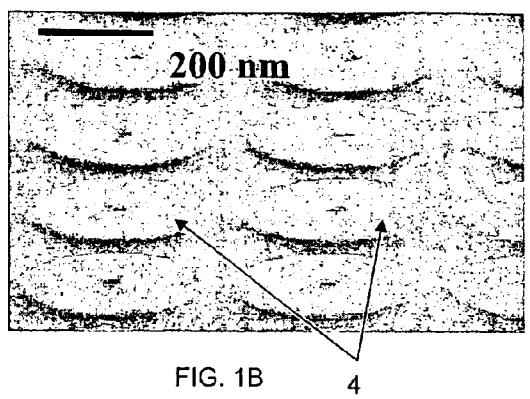
Figure 1C:
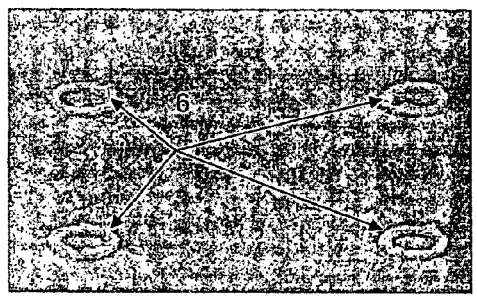
Figure 1D:
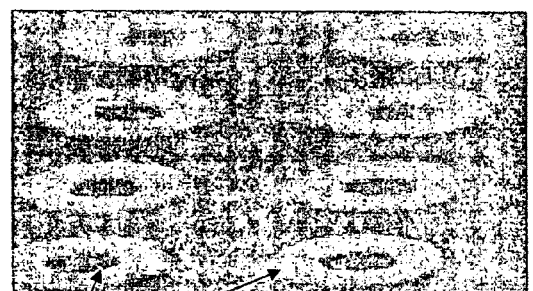

The invention uses fabricated circular rings with diameters of approximately 50 nm and above, and widths of approximately 30 nm and above. These nanorings are fabricated by a liftoff process from ring-shaped patterns written into a resist layer by electron-beam lithography. To create shapes as close as possible to a perfect ring, the electron beam was deflected in a circular trajectory with a precision of 2 nm. Magnetic films comprising of 2 nm or more of Co or Permalloy ($Ni_{80}Fe_{20}$) or other magnetic materials, coated with 3 nm Cu to prevent oxidation, are deposited onto the resist patterns. The films are made either by electron-beam evaporation in a chamber with a base pressure of $10^{-6}$ Torr, or by ion-beam sputtering at 0.1 mTorr in a chamber with a base pressure of $10^{-9}$ Torr. In each case the films were polycrystalline with grain size of approximately 10 nm, and substrates were oxidized silicon. FIGS. 1A–1D are scanning micrographs of Co rings having varying diameters and widths. FIG. 1A shows four ring structures 2 having diameters of 180 nm and widths of 50 nm. FIG. 1B shows ring structures 4 having diameters of 360 nm and widths of 160 nm. FIG. 1C shows ring structures 6 having diameters of 190 nm and widths of 30 nm. FIG. 1D shows ring structures 8 having diameters of 360 nm and widths of 110 nm.

The magnetic states of the nanorings 2, 4, 6, and 8 are imaged by magnetic force microscopy (MFM), using a Digital Instruments Nanoscope with a low-moment commercial tip. The tip height during scanning was 35 nm. The nanorings 2, 4, 6, and 8 are saturated in an in-plane magnetic field, applied using permanent magnets attached to an adjustable fixture, then the field was removed and the rings imaged at remanence.

Figure 2A:
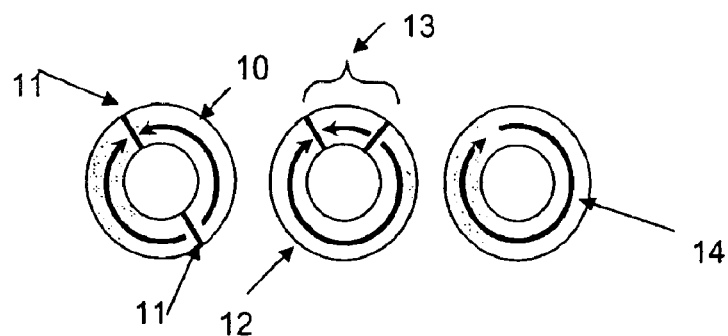
FIG. 2A is a schematic diagram illustrating the onion, twisted, and vortex states in a ring structure.
Figure 2B:
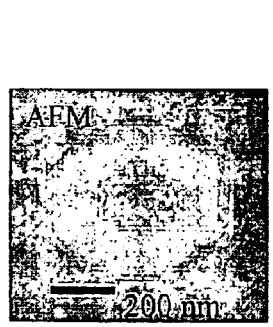
FIG. 2B is a atomic force micrograph of an inventive ring structure.
Figure 2C:
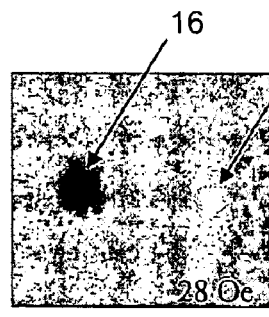
FIGS. 2C–2G are MFM images of the inventive ring structure.
Figure 2D:
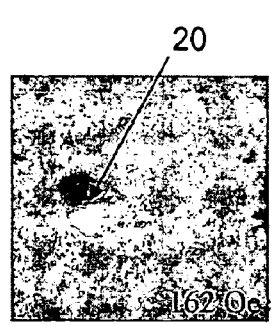
Figure 2E:
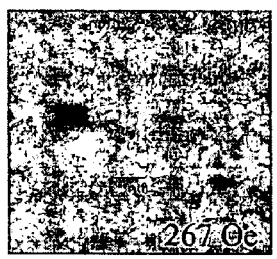
Figure 2F:
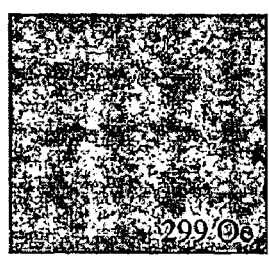

FIG. 2A shows a schematic diagram of the onion 10, twisted 12, and vortex 14 states in a ring structure. The arrows represent magnetization directions within the rings. Two 180° domain walls 11 are present in the onion state 10. One 360° domain wall 13 is present in the twisted state 12. FIG. 2B shows a topographical image of one 520-nm diameter Co ring. FIGS. 2C–2G show the evolution of the magnetic states of the same 520-nm diameter Co ring as a function of reverse magnetic field. After saturation, the ring is present in an onion state, as shown in FIG. 2C, which is characterized by dark and light contrast at opposite sides of the ring originating from the two 180° domain walls 16 and 18. At a certain reverse field, in this case 299 Oe, the ring disappears from the image as a vortex state forms, as shown in FIG. 2F. The vortex state has zero external field so it does not produce any MFM contrast. Both the onion and vortex states have been identified previously in rings. However, over a range of fields smaller than that needed to produce the vortex state, a new state is visible, which is called a twisted state. This state, which can be seen in FIGS. 2D and 2E, is characterized by adjacent light and dark contrast 20 at one side of the ring.

There are four possible variants of the twisted state, depending whether the dark-light contrast is on the left or right of the ring, and whether the dark spot is above or below the light spot. All of these variants have been observed in our rings. This behavior contrasts with that seen in larger rings where a direct transition from an onion to a vortex was reported. Although FIGS. 2B–2F show a 520 nm diameter ring, similar magnetization states can be seen in 180 nm and 320 nm rings.

Figure 2G:
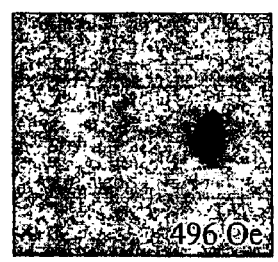

The twisted state is formed from the onion state by the movement of one 180° wall around the ring until it reaches the other 180° wall. Significantly, the resulting twisted state can have an extensive range of stability with respect to applied field, for example they can exist over fields of several hundred Oe. The twisted states do not represent a configuration where two 180° domain walls are coincidentally pinned next to one another by an irregularity in the ring. If that were the case, it might be expected to see other examples where 180° walls are pinned at different positions around the rings. All of the twisted states have the same MFM contrast, and thus appear to represent a distinct magnetic state containing two interacting 180° walls that do not annihilate each other, but instead form a single 360° domain wall. At sufficiently high fields, the twisted states turn into vortex states and eventually into onion states of opposite orientation to the starting onion state, as shown in FIG. 2G.

Figure 3A:
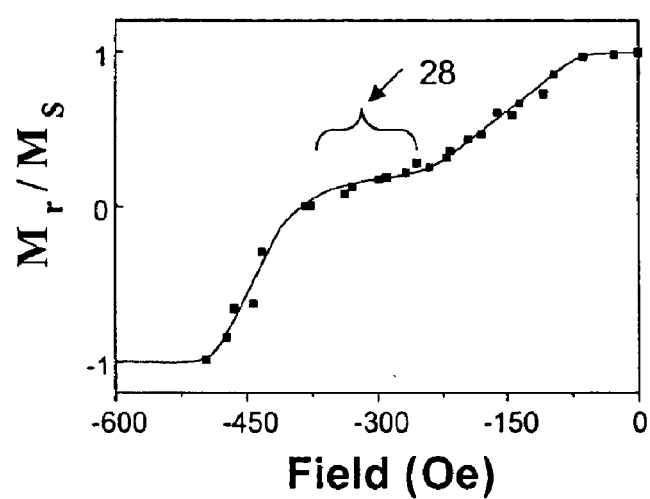
FIG. 3A is a graph illustrating a remanent hysteresis loop of an array where the rings have diameter of 520 nm.
Figure 3B:
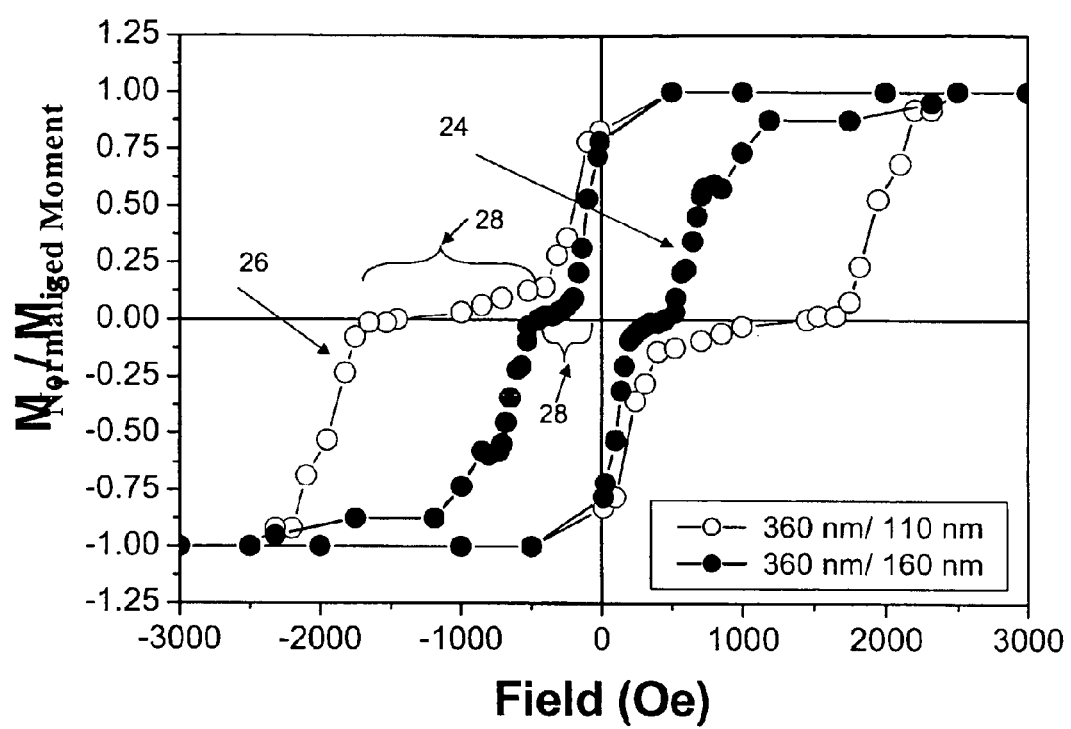
FIG. 3B is a graph demonstrating remanent hysteresis loops for two arrays with ring diameters of 360 nm and widths of 110 nm and 160 nm.

FIGS. 3A and 3B show hysteresis loops for arrays of rings. FIG. 3A corresponds to an array of rings with 520 nm diameter and 175 nm width. FIG. 3B corresponds to arrays of rings with 360 nm diameter and 160 nm width 24, or 360 nm diameter and 110 nm width 26. Two steps can be seen in each hysteresis loop, as reported for larger rings: a low-field step corresponding to the destruction of the positive onion state, and a high-field step corresponding to the creation of the reverse onion state. Between these steps is a plateau region 28 corresponding to the existence of onion or twisted states. The steps occur at higher fields for rings with narrower widths or smaller diameters, and the plateau regions 28 are wider for rings with narrower widths. FIGS. 3A and 3B therefore show that the magnetic field needed to form the onion, twisted or vortex states can be controlled by changing the geometry of the ring, which is useful in designing data storage devices based on rings.

Twisted states can conveniently be formed by introducing asymmetry into the ring. For instance, notches are known to pin walls in rings. If a small notch or other asymmetry such as edge roughness or microstructural variation is present, then when a reverse field is applied to a ring in an onion state, one of its 180° walls will begin to move at a lower applied field than the other, leading to the formation of a twisted state, instead of a direct transition from one onion state to the other by the simultaneous movement of the two walls. Asymmetry can be deliberately introduced into a ring by creating a small notch which pins one of the 180° walls in the onion state. Application of a reverse field is then very likely to result in the formation of a twisted state. The twisted state, which contains a 360° wall, is metastable, but it cannot relax into a vortex state unless it is perturbed. This makes it useful for data storage.

Figure 4A:
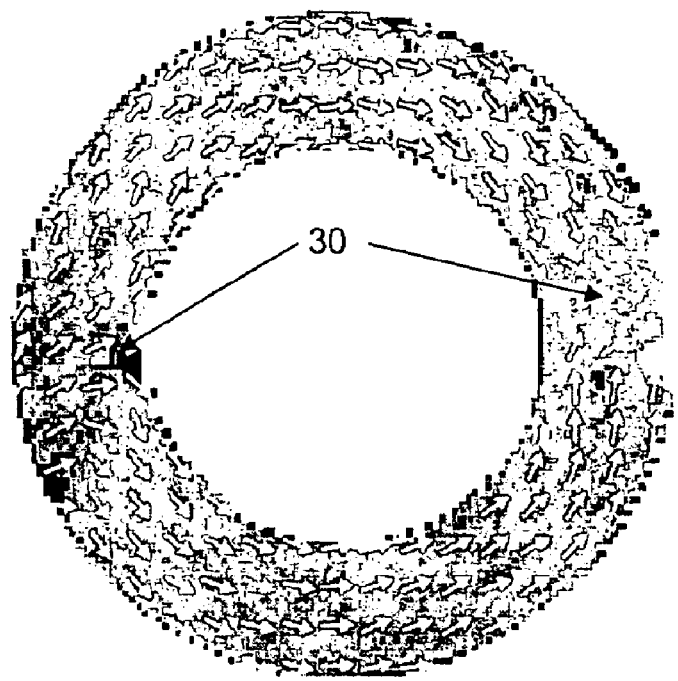
FIGS. 4A–4B are micromagnetic simulations of magnetization patterns in 520 nm diameter, 110 nm wide and 10 nm thick Co rings.
Figure 4B:
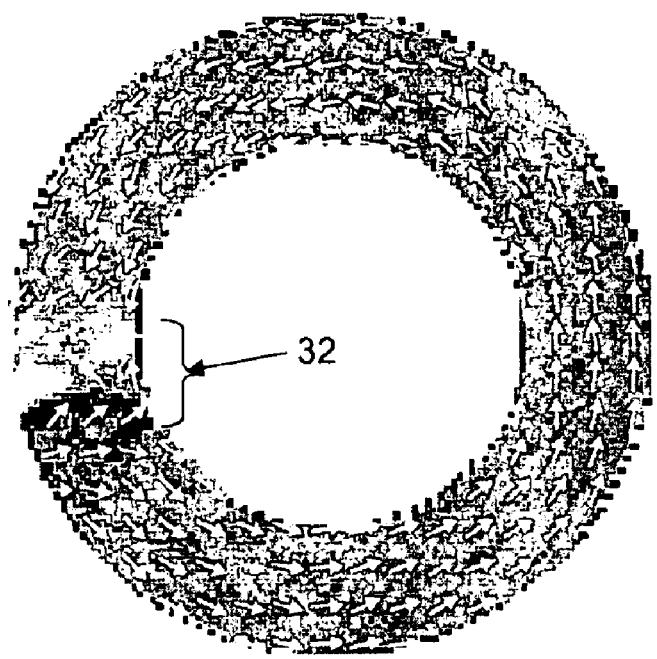

FIG. 4A shows a micromagnetic calculation of the magnetic configuration in the onion-state of a 520 nm diameter, 110 nm wide, 10 nm thick Co ring in which the two 180° walls 30, can be seen. FIG. 4B shows a calculation of the magnetic configuration in the twisted-state for the same ring, in which the 360° wall 32 can be seen. The small arrows represent the local magnetization directions. Modeling shows that smaller rings can more easily support twisted states.

More complex configurations such as a double twisted state have also been observed in nanorings. FIG. 5A shows a 520 nm diameter ring that was originally saturated to form an onion state. The two 180° walls 36 and 38 can be seen. On application of a reverse field, a double twisted state containing two 360° walls, 41, was created, shown in FIG. 5B. At an even higher field, as shown in FIG. 5C, a configuration containing a 540° wall, 41, and a 180° wall, 42, was formed. At even higher field a reverse onion state, with two 180° walls, 44, was formed. This behavior was reproducible and shows that a large number of complex states can exist in rings.

The existence of a twisted state in nanorings can be used in magnetoelectronic devices comprising ring-shaped elements. It increases the possible number of observable states in a single-layer nanoring from the four previously known (two opposite onion states and two opposite vortex states) to at least eight (including four variants of the twisted state), or many more if complex structures such as FIG. 5B and FIG. 5C are included. If the ring consists of a multilayer such as a spin-valve or tunnel junction, with more than one magnetic layer, there is clearly an even larger number of possible magnetic states. The 360° walls in twisted states are expected to have larger magnetoresistance than a 180° wall, and are therefore suitable for magnetoresistive readback in a data storage or magnetic logic device.

As mentioned above, the twisted state is a higher energy configuration than a vortex state, so it represents a metastable configuration. However, it has been shown that the stability range of twisted states can be several hundred Oe, exceeding the stability range over which vortex states exist, so it is possible to create and manipulate twisted states in narrow rings or other useful geometries.

By using twisted magnetic states of rings to store data, more than one bit per ring can be stored, which increases storage capacity. It is found that the vortex states become less easy to form at small ring diameters, and the remanent state of the ring is an onion state. Therefore, using the onion and twisted states becomes easier for smaller rings. FIGS. 6A–6D illustrate a possible association between the states of a ring and its bit arrangement. The ring includes a small notch and when the notch in the ring breaks the symmetry it allows various twisted states to be formed controllably. Note this arrangement allows 2 bits per ring.

Figure 6A:
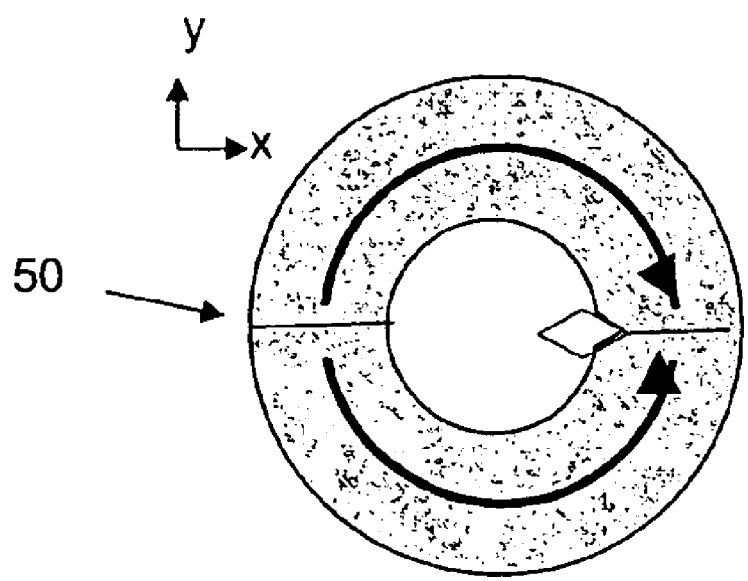
FIGS. 6A–6D are schematic diagrams illustrating the association between the states of a ring to a bit arrangement.
Figure 6B:
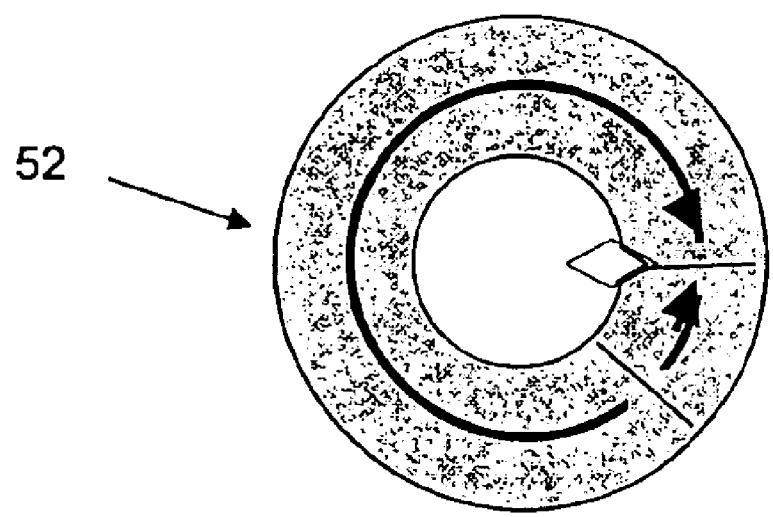
Figure 6C:
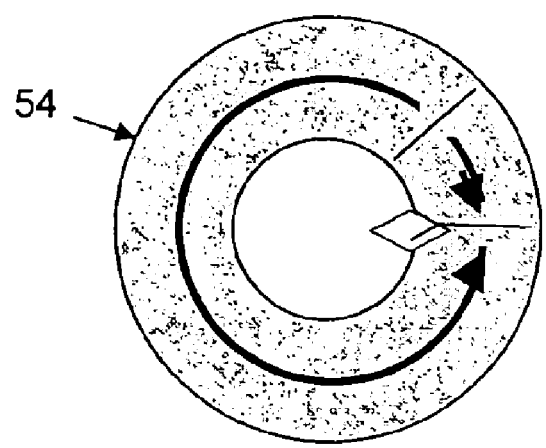
Figure 6D:
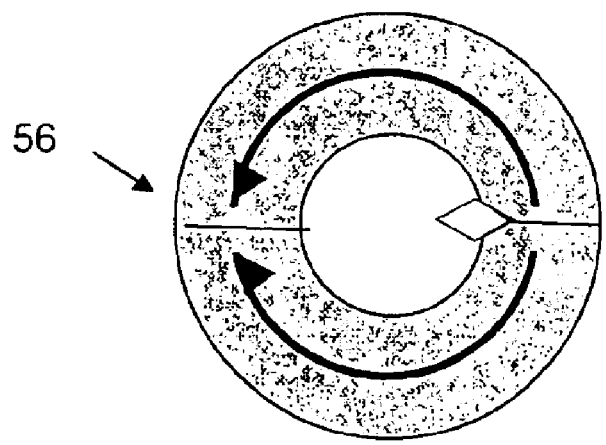

FIG. 6A shows a field being applied along the x-direction to generate an onion state. The onion state 50 is stable when the field is removed. This onion state 50 represents the bits 00. FIG. 6B shows a field being applied along the y-direction, which pushes the left-hand wall downwards, then along the −x-direction to generate a twisted state 52. This twisted state 52 is stable, and represents the bits 10. By applying a separate field along the −y and −x directions of the onion state 50, a twisted state 54 is formed to represent bits 01. Note the twisted state 52 is oppositely aligned compared to twisted state 54. Moreover, by applying a larger field to the twisted state 54 along the −x-direction, an onion state 56 is formed that is oppositely aligned to onion state 50. This onion state 56 represents bits 11. The x and y fields are applied using perpendicular conductor lines.

Figure 7:
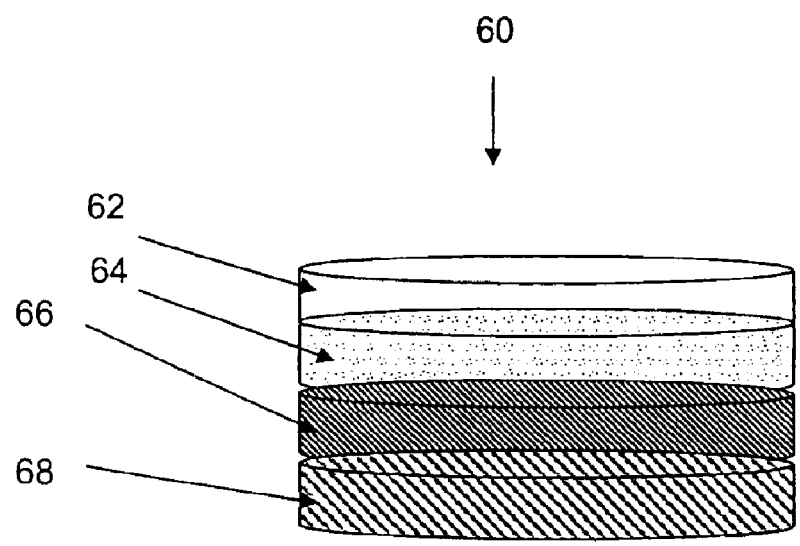
FIG. 7 is a schematic diagram of a readback mechanism used in accordance with the invention.

To detect the states described in FIGS. 6A–6B, a magnetic readback mechanism 60 can be formed, as shown in FIG. 7. The readback mechanism 60 is similar to a conventional magnetic random access memory architecture, and includes a magnetic storage layer 62, a non-magnetic spacer 64, a pinned magnetic or hard layer 66, and an antiferromagnetic layer 68. The pinned or hard layer 66 is always magnetized in one direction, due to the antiferromagnetic layer, or because it has a high coercivity. In addition, the pinned or hard layer 66 could also be a synthetic antiferromagnetic multilayer to reduce stray fields. The spacer 64 can include materials such as Cu, $Al_2O_3$, or the like. The storage layer 62 comprises a ring structure that is similar to the ring structure described in FIGS. 6A–6D and includes all the states recited therein.

The pinned or hard layer 66 is magnetized in the +x direction. With the storage layer 62 in the first onion state 50, the resistance is low and in the second onion state 56 the resistance is high. In twisted states 52, 54, the resistance is intermediate, but in these states can be distinguished by applying a small field along the y-direction and looking at the change in resistance, since twisted states 52 and 54 respond differently to y-fields.

Other variations are possible, for example, by applying a large enough y-field to twisted states 52 or 54 to create a vortex state so each ring can store six possible states instead of four. Note that onion, vortex, and twisted states can be formed in a single ring. For readback, the resistance of the vortex state will be similar to that of twisted states 52 and 54, but the response to a small perturbing y-field will be different.

This method is not limited to circular rings. Rings with elliptical or other shapes can also support twisted states and can therefore be used for data storage. Pinning of one wall can be accomplished by a notch at the inner diameter as shown in FIG. 6, or by a notch at the outer diameter, a constriction, or other asymmetry of geometrical, compositional, or microstructural origin.

Magnetic rings containing twisted states can also be used in magnetic logic devices that store and process data. For example, 180° or 360° or more complex walls can be formed in a ring as illustrated in FIG. 6, then the walls can be transferred into a magnetic line or channel contacting the ring by application of a magnetic field. By allowing the magnetic lines from several rings to intersect, this enables the walls from several rings to be combined, or transferred onto yet another ring. This enables digital logic operations to be carried out in addition to data storage operations.

Although the present invention has been shown and described with respect to several preferred embodiments thereof, various changes, omissions and additions to the form and detail thereof, may be made therein, without departing from the spirit and scope of the invention.

What is claimed is:

1. A magnetic-ring structure comprising at least two states and at least one twisted state that includes a 360° domain wall that can exist over a wide range of applied fields.

2. The magnetic-ring structure of claim 1, wherein said at least two states comprise at least one onion state.

3. The magnetic-ring structure of claim 1, wherein said at two states comprise at least one vortex state.

4. The magnetic-ring structure of claim 1, wherein said at least one twisted state comprises two states.

5. The magnetic-ring structure of claim 1, wherein said at least one twisted state comprises four states.

6. A method of operating a magnetic-ring structure comprising:

providing said magnetic-ring structure with at least two states; and providing at one twisted state that includes a 360° domain wall that can exist over a wide range of applied fields.

7. The method of claim 6, wherein said at least two more states comprise at least one onion state.

8. The method of claim 6, wherein said at least two states comprise at least one vortex state.

9. The method of claim 6, wherein said at least one twisted state comprises four states.

10. The method of claim 6, wherein said at least one twisted state comprises two states.

* * * * *